United States Patent [19]
Makita et al.

[11] Patent Number: 5,936,291
[45] Date of Patent: Aug. 10, 1999

[54] THIN FILM TRANSISTOR AND METHOD FOR FABRICATING THE SAME

[75] Inventors: Naoki Makita, Nara; Muneyuki Motohashi, Tenri; Hidehiko Yamashita, Yamatokoriyama; Hideo Izawa, Kitakatsuragi-gun, all of Japan

[73] Assignee: Sharp Kabushiki Kaisha, Osaka, Japan

[21] Appl. No.: 09/016,337

[22] Filed: Jan. 30, 1998

[30] Foreign Application Priority Data

Feb. 3, 1997 [JP] Japan .................................. 9-020676

[51] Int. Cl.$^6$ .......................... H01L 29/76; H01L 29/94; H01L 31/062; H01L 31/113
[52] U.S. Cl. .......................... 257/405; 257/349; 257/351; 257/352; 257/402; 257/651; 438/149; 438/162; 438/166
[58] Field of Search ..................... 257/349, 351, 257/352, 402, 405, 651, 905; 438/149, 162, 166

[56] References Cited

U.S. PATENT DOCUMENTS

| | | |
|---|---|---|
| 3,945,031 | 3/1976 | Kahng et al. . |
| 5,172,204 | 12/1992 | Hartstein . |
| 5,767,548 | 6/1998 | Wondrak et al. ..................... 257/347 |

FOREIGN PATENT DOCUMENTS 5-121681  5/1993  Japan .

*Primary Examiner*—Ngân V. Ngô
*Attorney, Agent, or Firm*—Nixon & Vanderhye, P.C.

[57] ABSTRACT

The thin film transistor of this invention is formed on a substrate and includes an active layer and a first insulating film and a second insulating film sandwiching the active layer, wherein the overall polarity of fixed charges contained in the first insulating film is the reverse of the overall polarity of fixed charges contained in the second insulating film.

26 Claims, 8 Drawing Sheets

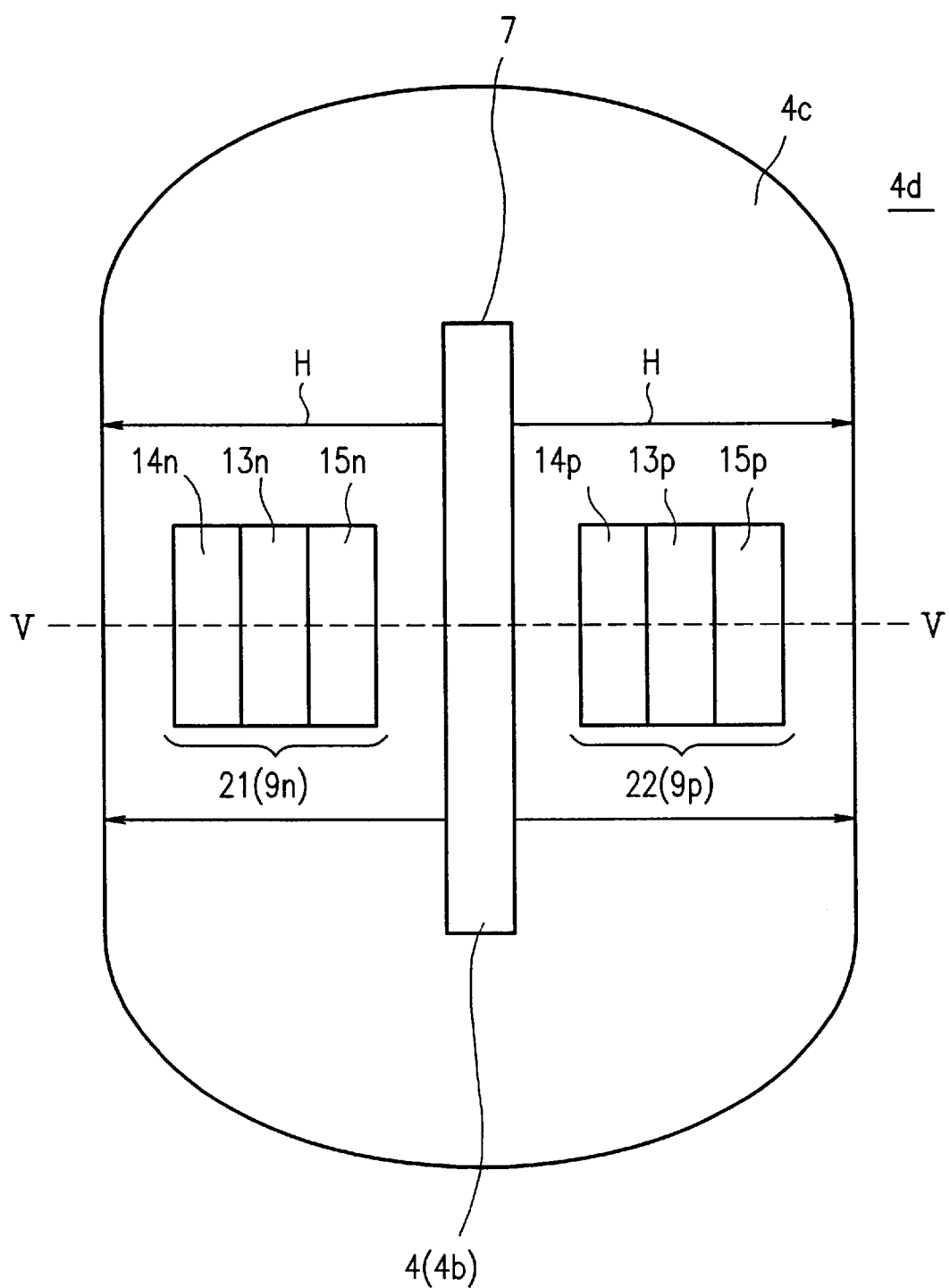

ing films, and a method for fabricating the same. More particularly, the present invention relates to a MOS thin film transistor used for an active matrix substrate, a thin film integrated circuit in general, an image sensor, and the like.

THIN FILM TRANSISTOR AND METHOD FOR FABRICATING THE SAME

BACKGROUND OF THE INVENTION

1. Field of the Invention

The present invention relates to a thin film transistor having an active region interposed between insulating films, and a method for fabricating the same. More particularly, the present invention relates to a MOS thin film transistor used for an active matrix substrate, a thin film integrated circuit in general, an image sensor, and the like.

2. Description of the Related Art

In recent years, efforts have been made to form high-performance semiconductor elements on an insulating substrate such as a glass substrate or on an insulating film for realization of a large-scale liquid crystal display device with high resolution, a monolithic liquid crystal display device with a driver circuit formed on the same substrate for cost reduction, a fit-type image sensor with high speed and high resolution, a three-dimensional integrated circuit (IC), and the like. As a semiconductor element used for these devices, a MOS thin film transistor (TFT) using a silicon semiconductor thin film as an active region is generally used.

A typical configuration of such a MOS TFT is of a coplanar type as shown in FIG. 6. The coplanar type transistor includes the following components. A silicon thin film which is to be an active layer 9 is formed on an insulating substrate 1. The active layer 9 is divided into two types of regions, i.e., a source region 14 and a drain region 15 which are doped with n-type or p-type impurities, and a channel region 13 which actually serves as an active region of the transistor. A gate insulating film 10 is formed to cover the active layer 9, and a gate electrode 11 is formed above the channel region 13. An interlayer insulating film 17 is formed to cover the resultant substrate, and a source electrode 18 and a drain electrode 19 are formed on the interlayer insulating film 17.

In an IC fabrication process, in general, an Si single-crystalline substrate is used and the surface of the substrate is oxidized at high temperature to obtain a gate insulating film. The resultant gate insulating film made of silicon oxide has significantly high quality, and the interface between the active layer (Si substrate) and the gate insulating film is kept clean, providing an excellent interface characteristic.

On the contrary, in the TFT fabrication process described above, the gate insulating film 10 needs to be formed by deposition. This makes it basically difficult to obtain such a high-quality silicon oxide film as that obtained by the thermal oxidation in the IC fabrication process. In the TFT fabrication process, also, the active layer needs to be patterned before the formation of the gate insulating film as is observed from FIG. 6. It is not possible, therefore, to form the gate insulating film in succession with the formation of the active layer 9. The resulting interface between the active layer 9 and the gate insulating film 10 does not provide as good characteristics as those obtained in the IC fabrication process. As a result, the threshold voltage of the TFT is unstable.

A method for fabricating a CMOS-FET (complementary metal oxide semiconductor field effect transistor) in an SOI (silicon-on-insulator) process using an Si single-crystalline substrate has been proposed in Japanese Laid-Open Publication No. 5-121681. The technique disclosed in this publication is restricted to the CMOS-FET fabricated in the SOI process. According to this technique, in order to reduce a short channel effect, fixed charges in an underlying oxide film formed on the Si substrate are utilized. That is, negatively charged ions are implanted in the underlying oxide film for an n-channel FET, while positively charged ions are implanted for a p-channel FET.

In the MOS TFT, fixed charges in the gate insulating film are one of the factors influencing the threshold voltage of the TFT. However, a silicon oxide film formed by deposition is unstable in quality and includes a number of fixed charges in the film. In general, a film formed by CVD (chemical vapor deposition) includes a number of SiOH groups, where Si dangling bonds act as positive charges. As a result, a semiconductor layer in contact with the gate insulating film becomes an n-type layer under the influence of the positive charges. The threshold voltage of the TFT thus shifts toward a negative value, exhibiting a depletion type characteristic. The "depletion type" is a type where a drain current is allowed to flow when the gate voltage is 0.

The TFT should desirably have at least an enhancement type characteristic, not the depletion type characteristic, when the TFT is used for a thin film IC such as a CMOS inverter circuit, and an active matrix substrate and a driver circuit therefor for a liquid crystal display device. The "enhancement type" is a type where a drain current is not allowed to flow when the gate voltage is 0. In addition to having the enhancement type characteristic, the absolute value of the threshold voltage of the TFT should be desirably as small as possible, to reduce the driving voltage.

In consideration of the above, the threshold voltage of a TFT is typically controlled by directly implanting n-type impurities or p-type impurities in the channel region of the transistor. However, the impurities implanted in the channel region dull the rising of a drain current in the subthreshold region during the operation of the MOS transistor, as well as increasing the leak current during the non-operation thereof. In other words, the driving capability of the transistor itself is lowered in compensation for the control of the threshold voltage.

The method disclosed in the above-mentioned publication where negatively charged ions are implanted for an n-channel FET and positive charges are implanted for a p-channel FET may be applied to the TFT, though the objective of the technique is somehow different from the objective of controlling the threshold voltage of the transistor. In this method, however, since an n-channel TFT and a p-channel TFT are separately controlled, it is difficult to stabilize the difference in the absolute value of the threshold voltage between the n-type and p-type TFTs. Moreover, this method requires two ion implantation steps. This complicates the fabrication process and increases the cost.

In view of the above, an objective of the present invention is to provide a thin film transistor with high characteristic stability, high performance, and low power consumption formed on an insulating surface of a substrate, and a method for fabricating such a thin film transistor.

Another objective of the present invention is to provide a method for fabricating a thin film transistor which can control and optimize the variation in the threshold voltage observed in the thin film transistor in a low-cost simple process in order to realize a larger-size active matrix liquid crystal display device with higher resolution, a driver-monolithic active matrix liquid crystal display device with a driver formed on a same substrate, a thin film IC, and the like.

SUMMARY OF THE INVENTION

The thin film transistor of this invention is formed on a substrate and includes an active layer and a first insulating film and a second insulating film sandwiching the active layer, wherein the overall polarity of fixed charges contained in the first insulating film is the reverse of the overall polarity of fixed charges contained in the second insulating film.

In one embodiment of the invention, the thin film transistor is a MOS field effect transistor, and the second insulating film constitutes a gate insulating film of the field effect transistor.

In another embodiment of the invention, a threshold voltage of the thin film transistor is controlled based on the polarities and amounts of the fixed charges contained in the first insulating film and the second insulating film.

In still another embodiment of the invention, the substrate is a glass substrate, and the first insulating film is an underlying film for preventing impurities from diffusing from the glass substrate to the active layer.

In still another embodiment of the invention, at least one of the first insulating film and the second insulating film contains silicon oxide as a major component, and the active layer includes a silicon thin film having crystallinity.

In still another embodiment of the invention, a thickness of the active layer is equal to or less than a thickness of a depletion layer which expands during operation of the thin film transistor.

In still another embodiment of the invention, positive fixed charges of the first insulating film or the second insulating film are mainly composed of silicon ions having silicon dangling bonds.

In still another embodiment of the invention, negative fixed charges of the first insulating film or the second insulating film are mainly composed of oxygen ions of non-bonded oxygen.

According to another aspect of the present invention, a method for fabricating a thin film transistor is provided. The method includes the steps of: forming a first silicon oxide film on a substrate; forming a silicon film having crystallinity which is to be an active layer on the first silicon oxide film; and forming a second silicon oxide film having fixed charges of a polarity reverse of a polarity of fixed charges contained in the first silicon oxide film on the silicon film as a gate insulating film.

In one embodiment of the invention, the step of forming a first silicon oxide film is performed by sputtering, and the step of forming a second silicon oxide film is performed by CVD.

In another embodiment of the invention, the step of forming a first silicon oxide film is performed by sputtering under an atmosphere containing at least oxygen using quartz as a target.

In still another embodiment of the invention, the step of forming a second silicon oxide film is performed by CVD using a silane gas as a material.

In still another embodiment of the invention, wherein after being formed by CVD, the second silicon oxide film is heat-treated at a temperature of about 550° C. or more.

In still another embodiment of the invention, in the step of forming a first silicon oxide film, a threshold voltage is controlled by controlling a partial pressure of oxygen under an atmosphere for sputtering.

In still another embodiment of the invention, an oxygen ratio under an atmosphere for sputtering in the step of forming a first silicon oxide film is in a range of about 0.04 to about 0.4.

In still another embodiment of the invention, the step of forming a first silicon oxide film includes the step of doping ions which are to be negative fixed charges in the first silicon oxide film after the first silicon oxide film is formed.

In still another embodiment of the invention, in the step of doping ions, a threshold voltage is controlled by controlling an ion implantation amount.

In still another embodiment of the invention, the ions to be implanted in the step of doping ions are oxygen ions.

In still another embodiment of the invention, the ions to be implanted in the step of doping ions are aluminum ions.

In still another embodiment of the invention, a thickness of the active layer is about 60 nm or less.

In still another embodiment of the invention, the step of forming a silicon film which is to be the active layer includes irradiating an amorphous silicon film with laser light to crystallize the silicon film in a solidification process from a melted state.

In still another embodiment of the invention, an excimer laser light with a wavelength of about 400 nm or less is used as the laser light for the crystallization of the amorphous silicon film.

In still another embodiment of the invention, the step of forming a silicon film which is to be the active layer includes adding a catalyst element which facilitates the crystallization of an amorphous silicon film to the amorphous silicon film, heat-treating the amorphous silicon film, and crystallizing the amorphous silicon film in a solid-phase state.

In still another embodiment of the invention, the step of forming a silicon film which is to be the active layer includes selectively adding a catalyst element which facilitates the crystallization of an amorphous silicon film to the amorphous silicon film, and heat-treating the amorphous silicon film to allow crystal growth to proceed laterally from an area where the catalyst element has been selectively added toward a peripheral area thereof.

In still another embodiment of the invention, the catalyst element includes Ni.

In still another embodiment of the invention, the first silicon oxide film works as an underlying film which prevents impurities from diffusing from the substrate to the active layer.

Thus, the invention described herein makes possible the advantages of (1) providing a thin film transistor with high characteristic stability, high performance, and low power consumption formed on an insulating surface of a substrate, (2) a method for fabricating such a thin film transistor, and (3) a method for fabricating a thin film transistor capable of controlling and optimizing a variation in the threshold voltage of the thin film transistor in a low-cost simple process in order to realize a larger-size active matrix liquid crystal display device with higher resolution, a driver-monolithic active matrix liquid crystal display device with a driver formed on a same substrate, a thin film IC, and the like.

These and other advantages of the present invention will become apparent to those skilled in the art upon reading and understanding the following detailed description with reference to the accompanying figures.

BRIEF DESCRIPTION OF THE DRAWINGS

FIG. 4 is a plan view illustrating a fabrication method of Example 2 according to the present invention.

DESCRIPTION OF THE PREFERRED EMBODIMENTS

First, the outline and function of the present invention will be described with reference to FIGS. 1A, 1B, and 2.

The present invention aims at forming a TFT on a substrate so as to have an active layer and first and second insulating films vertically sandwiching the active layer so that the overall polarity of fixed charges contained in the first insulating film is the reverse of the overall polarity of fixed charges contained in the second insulating film. The "fixed charges" as used herein refers to charges which exist locally in the insulating film in a stable and immobilized state and have positive or negative polarity. The "overall polarity" as used herein refers to the polarity possessed by the type of charges with a higher density when two types of charges with the opposite polarities exist in one insulating film.

Figure 1A:
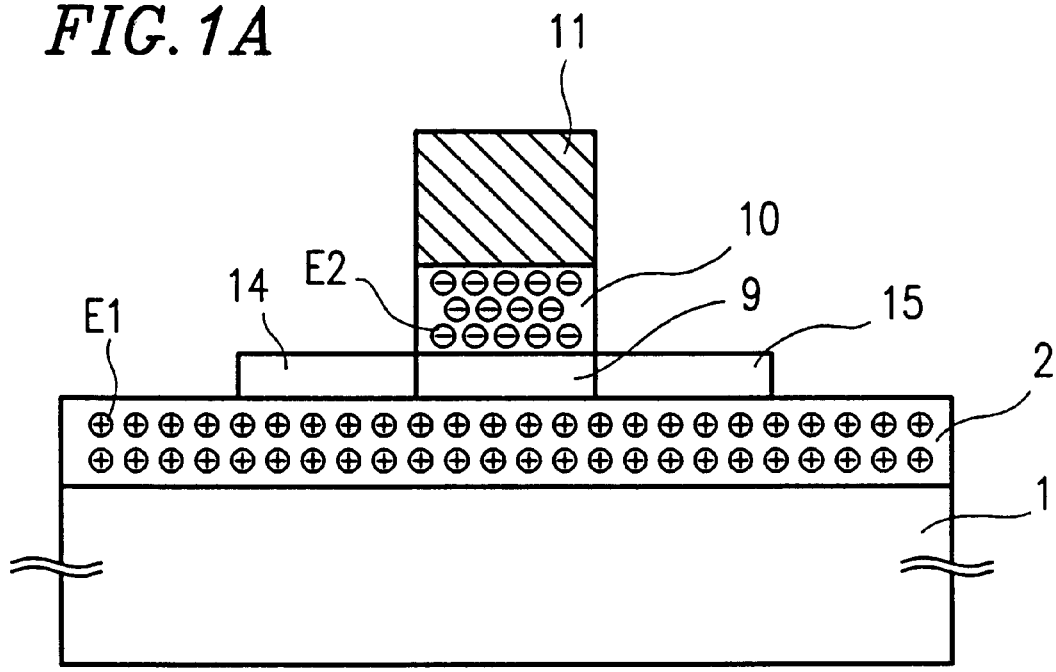
FIGS. 1A and 1B are schematic sectional views of a TFT according to the present invention.
Figure 1B:
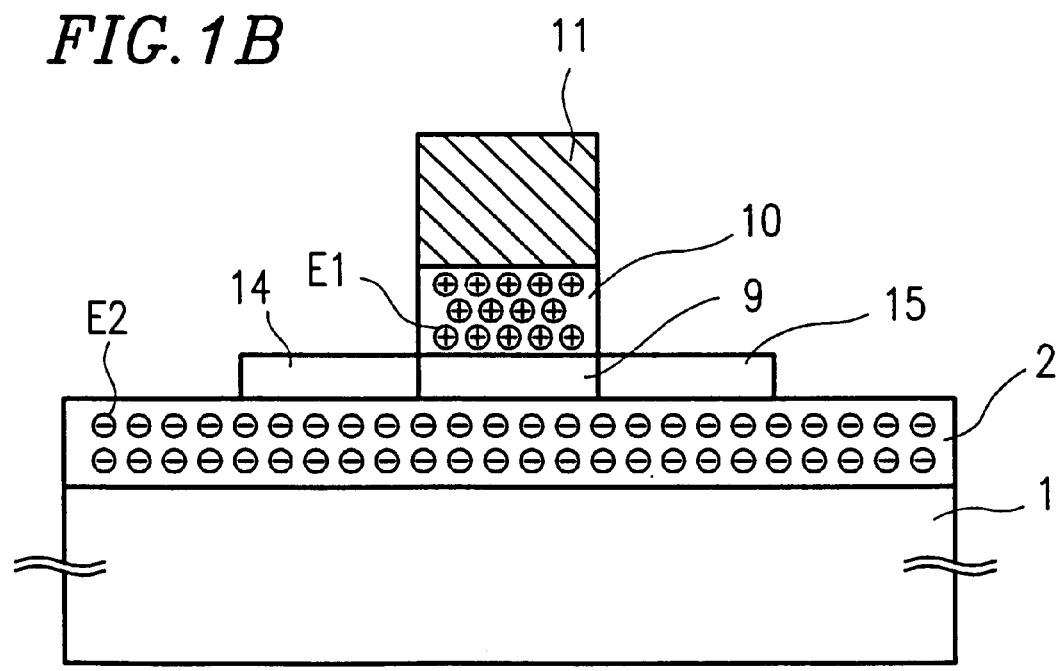
Figure 2:
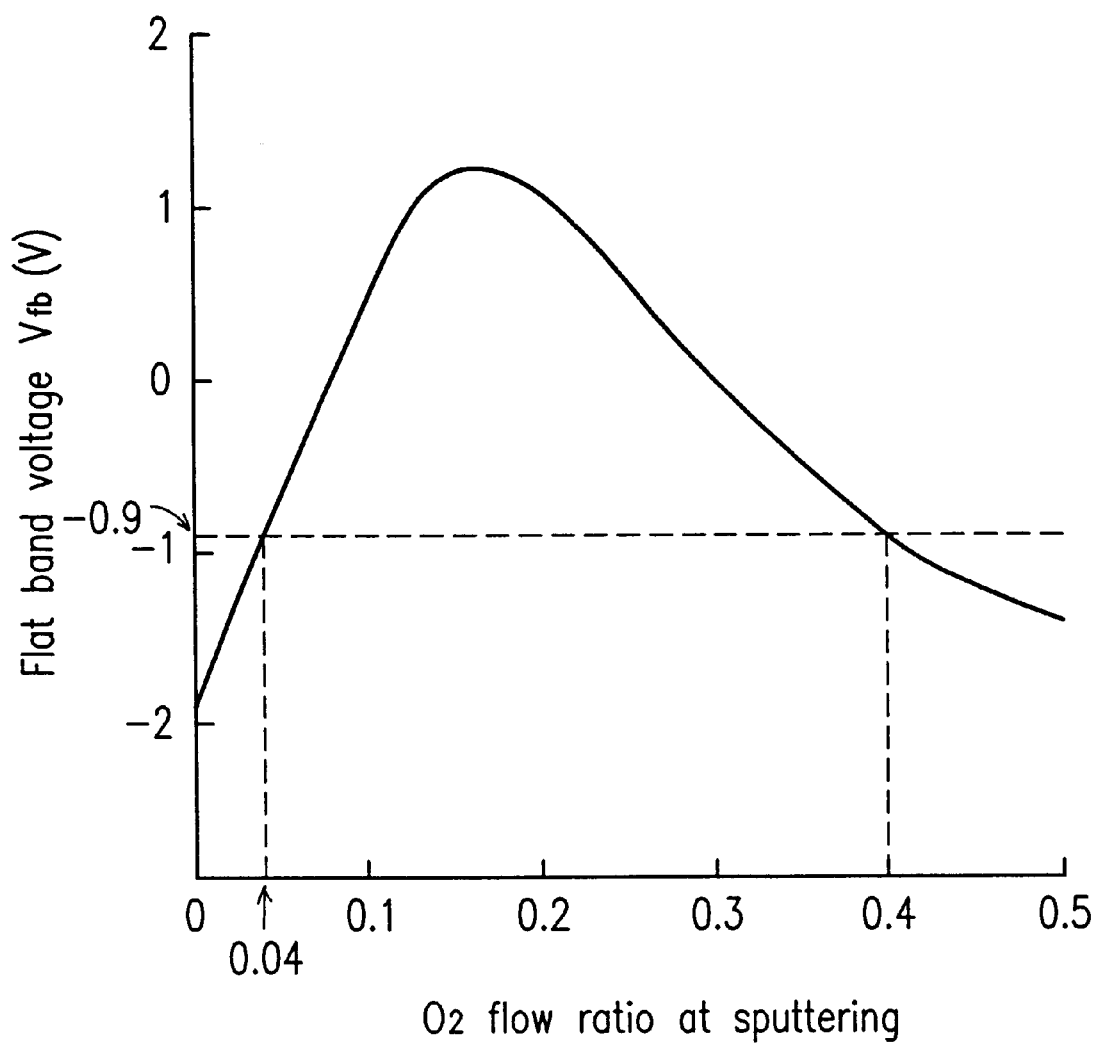
FIG. 2 is a graph showing the relationship between the $O_2$ flow ratio at sputtering in forming an $SiO_2$ film and the flat band voltage according to the present invention.

Referring to FIGS. 1A and 1B, the outline of the present invention will be described. The TFT of the present invention includes an active layer 9 and a first insulating film 2 and a second insulating film 10 vertically sandwiching the active layer 9 formed on a substrate 1 made of glass or the like. The active layer 9 includes n-type or p-type contact layers 14 and 15. An electrode 11 is formed on the second insulating film 10.

In the case where the first insulating film 2 has positive fixed charges E1 as shown in FIG. 1A, the second insulating film 10 is made to have negative fixed charges E2. On the contrary, in the case where the first insulating film 2 has negative fixed charges E2 as shown in FIG. 1B, the second insulating film 10 is made to have positive fixed charges E1. With this arrangement, the influence of the first insulating film 2 on the active layer 9 and the influence of the second insulating film 10 on the active layer 9 are cancelled with each other, to allow the active layer 9 to be in a near intrinsic state.

A MOSFET is considered to be the transistor for which the present invention is most effective. When the MOSFET is formed, the second insulating film 10 should desirably constitute a gate insulating film for the following reason. The threshold voltage of a MOS transistor varies due to an influence of fixed charges in a gate insulating film. By applying the present invention, the threshold voltage of the transistor is stabilized, and thus a thin film IC and the like capable of being driven with low power consumption can be obtained.

In the MOSTFT, also, the threshold voltage can be controlled based on the polarities and amounts of the fixed charges E1 and E2 contained in the first insulating film 2 and the second insulating film 10. This threshold voltage control method, which does not have direct relation with the active layer 9 (channel region), does not adversely affect the active region 9 at all, unlike the conventional method where impurities are directly doped in the channel region of the TFT to control the threshold voltage. In other words, according to the present invention, the threshold voltage can be controlled without causing troubles such as the dulling of the rising of the drain current in the subthreshold region and the increase in the leak current during the non-operation of the transistor, which are observed in the conventional threshold voltage control method for MOSTFTs.

It is effective to use a glass substrate as the substrate 1 of the TFT according to the present invention and use the first insulating film 2 as an underlying film for preventing impurities from diffusing from the glass substrate. With this arrangement, not only the excellent effect of the present invention is obtained, but also cost reduction is realized since an inexpensive glass substrate is used. The trouble which may arise by using the glass substrate, i.e., the diffusion of impurities such as alkali metals in the glass to the active layer 9, can also be prevented by the underlying film. In other words, the first insulating film 2 can play the two roles of controlling the threshold voltage of the TFT and preventing the diffusion of impurities from the glass substrate. Thus, the present invention can be effectively utilized without increasing the number of production steps.

It is desirable that at least one of the first insulating film 2 and the second insulating film 10 is made of silicon oxide as a major component and that the active layer 9 is a crystalline silicon thin film.

The silicon oxide film has good affinity with the silicon film, so that the interface state therebetween can be reduced and the trap state density of charges such as carriers in the film is low. If these factors are large, apparent fixed charges E1 or E2 in the film will vary, and thus the insulating film will receive an external influence such as a gate bias applied to the TFT, for example. Accordingly, the silicon oxide film is most suitable as the insulating film used in the present invention. Films other than the silicon oxide film will fail to sufficiently obtain the effect of the present invention.

The silicon film which has good affinity with the silicon oxide film is most desirable as the active layer 9 as described above. More specifically, a crystalline silicon film having a sufficient carrier mobility to realize a higher-performance TFT of the present invention is most suitable. In reality, the threshold voltage varies more violently in a TFT using a crystalline silicon film as the active layer 9 than in a TFT using an amorphous silicon film, allowing for more minute control. This further increases the effect of the present invention.

The thickness of the active layer 9 is one of important points of the present invention.

According to the present invention, the active layer 9 is interposed between the first insulating film 2 and the second insulating film 10 as described above. If the polarities of the fixed charges E1 and E2 in the first and second insulating films 2 and 10 are different from each other, charges in the active layer 9 move, thereby inducing reverse charges in the interface between the first insulating film 2 and the active layer 9 and the interface between the active layer 9 and the second insulating film 10, so that the charges are stabilized. In other words, the TFT is in a so-called back-channel state where the upper side of the channel is of an n-type while the bottom side thereof is of a p-type. This state makes it difficult to obtain the effect of the present invention.

This problem can be overcome by reducing the thickness of the active layer 9 below a predetermined level. With such a thickness, the influences of the fixed charges E1 and E2 in the first and second insulating films 2 and 10 expand to the whole active layer 9, so that the whole active layer 9, not the respective interfaces, becomes an n-type or p-type layer. The effect of the present invention can be best utilized in this state. The thickness of the active layer 9 which realizes this state is defined as a thickness equal to or less than the thickness of a depletion layer which expands during the operation of the TFT, i.e., a thickness in the range where the whole active layer 9 is depleted.

Elements which adversely affect the semiconductor device as little as possible are most desirable as the elements for the fixed charges E1 and E2 in the first insulating film 2 and the second insulating film 10. Specifically, it is most preferable to use silicon ions having Si dangling bonds for the positive fixed charges E1 and oxygen ions of non-bonded oxygen for the negative fixed charges E2. Since these elements, i.e., silicon and oxygen, are originally contained in the silicon oxide films as the insulating films, they do not adversely affect the silicon film as the active layer 9, either.

The method for fabricating a TFT according to the present invention will be described. A first silicon oxide film as an underlying film is formed on the substrate 1, and a crystalline silicon film which is to be the active layer 9 is formed on the first silicon oxide film. Thereafter, a second silicon oxide film as the gate insulating film having the fixed charges E1 or E2 with the polarity reverse of the first silicon oxide film may be formed. Preferably, the first silicon oxide film is formed by sputtering, while the second silicon oxide film is formed by CVD.

The reason for using the above deposition methods is as follows. The second insulating film 10 works as the gate insulating film, and thus the channel surface of the TFT is composed of the interface between the active layer 9 and the second insulating film 10. It is therefore important to form the second insulating film 10 with high quality without damaging the surface of the underlying active layer 9 (channel surface). Moreover, in order to cover each of the active layers 9 patterned as individual islands, the second insulating film 10 is required to have a good step covering property for covering steps of each active layer 9. CVD is most suitable in this aspect. Thermal CVD using no plasma is most suitable in the aspect of not damaging the surface of the active layer 9, but plasma CVD can also be used without causing any special problem if especially high RF power is not applied.

However, using CVD for the second silicon oxide film has the following problem. The second silicon oxide film formed by CVD has positive fixed charges E1 generated by a bond defect of Si. Accordingly, in this case, a film having reverse fixed charges, i.e., negative fixed charges E2, must be used as the first silicon oxide film as the underlying film. It is however difficult to form a silicon oxide film having negative fixed charges E2 by any methods other than sputtering in consideration of the film formation conditions. Though the sputtering has an advantage of being able to form a finer silicon oxide film than the CVD, it greatly damages the underlying film at the film formation and is poor in the step covering property.

Thus, as the underlying film, the film formed by sputtering has advantages that it is effective as a barrier film for preventing impurities from diffusing from the substrate 1, that the underlying film is prevented from being melted when the active layer 9 is formed by crystallization where the layer melted with laser irradiation is solidified, and that impurities (including oxygen) entering the active layer 9 from the underlying film are minimized. On the contrary, the film formed by sputtering is very difficult to be used as the gate insulating film formed above the active layer 9. Thus, in order to utilize the advantages of the respective film formation methods to obtain the effect of the present invention satisfactorily, it is most desirable to form the first silicon oxide film by sputtering and the second silicon oxide film by CVD.

Specifically, the first silicon oxide film as the underlying film is preferably formed by sputtering using quartz as a target under an atmosphere containing at least oxygen. Reactive sputtering using single-crystalline silicon as a target can also be used without a special problem, but a silicon-rich state may be created if the conditions are not sufficiently satisfied, resulting in the formation of a film having positive fixed charges E1. By using the quartz target and the atmosphere containing at least oxygen, such a silicon-rich state can be prevented and a silicon oxide film which is more stable as the composition can be obtained.

The second silicon oxide film as the gate insulating film is preferably formed by CVD using a silane (including organic silane) gas as a material gas. Though the silicon oxide film formed by CVD using a silane gas contains a number of SiOH bonds, it only contains a low concentration of other impurities.

Since a silane gas is generated by decomposition at low energy, plasma CVD can be used for the formation of the silicon oxide film with hardly any damage to the underlying active layer 9 by the plasma.

The second silicon film formed by CVD is then desirably heat-treated at about 550° C. or more. The reason is that, since SiOH bonds are unstable, in order to stabilize the resultant film, it is preferable to remove OH groups from the bonds and allow remained Si dangling bonds to act as the positive fixed charges E1. To attain this, theoretically, an energy greater than the energy for bonding Si and OH is required. The inventors of the present invention have conducted experiments and found that the OH concentration abruptly reduces by heat treatment at 550° C. or more though the value is somewhat different from a theoretical value. This heat treatment is also effective in the aspect of obtaining a fine film, and thus further improves the pressure resistance characteristic required as the gate insulating film of the TFT.

In the TFT with the above configuration, the threshold voltage of the TFT can be controlled by controlling the partial pressure of oxygen in the atmosphere for sputtering at the formation of the first silicon oxide film as the underlying film. More specifically, the amount of supersaturated oxygen ions, i.e., the negative fixed charges E2, contained in the first silicon oxide film can be controlled by the partial pressure of oxygen during the sputtering. The amount of the fixed charges E2 influences the active layer 9, and consequently the threshold voltage of the TFT can be controlled. This method allows both the film formation and the threshold voltage to be controlled together at one time without performing an extra step such as an ion doping step for controlling the threshold voltage of the TFT. This simplifies the fabrication process effectively.

The ratio of oxygen in the atmosphere for sputtering at the formation of the first silicon oxide film is desirably in the range of about 0.04 (4%) to about 0.4 (40%). FIG. 2 shows a change in the flat band voltage ($V_{fb}$) at a silicon oxide film formed by sputtering using a quartz target with respect to the oxygen flow ratio. $V_{fb}$ was calculated from the C-V characteristics, at a measurement frequency of 1 MHz, of a MOS capacitor fabricated by forming a silicon oxide film on a p-type Si wafer ($Na=2\times10^{15}$ cm$^{-3}$) using an Al electrode. The density and polarity of fixed charges in the film can be estimated from $V_{fb}$. It is found from FIG. 2 that $V_{fb}$ is −0.9 or more when the oxygen flow ratio is in the range of about 0.04 to about 0.4. In the MOS capacitor with the above configuration, $V_{fb}$ of the silicon oxide film having no fixed charge E1 or E2 is about −0.9 V due to the work function between the silicon film and the Al electrode. Accordingly, the silicon oxide film has negative fixed charges E2 if $V_{fb}$ is more than this value, while it has positive fixed charges E1 if it is less than this value.

In other words, when the oxygen flow ratio is in the above-mentioned range, negative fixed charges E2 prominently exist in the silicon oxide film as a whole. When the oxygen flow ratio is outside the above range, oxygen-deficient Si atoms (positive fixed charges) increase, so that the negative and positive fixed charges cancel each other. As a result, a sufficient amount of negative fixed charges E2 required for the realization of the present invention are not likely to exist in the film as a whole. This makes it difficult to control the threshold voltage of the TFT.

An alternative fabrication method effective in the present invention includes doping the first silicon oxide film as the underlying film with ions which are to be negative fixed charges E2 after the formation of the first silicon oxide film. Though the number of steps increases in this alternative method, the film formation method for the underlying film is not restricted, but an optimal film formation method suitable for the intended TFT can be selected.

More specifically, when a pattern has been formed under the underlying film, for example, CVD may be employed since sputtering is not appropriate in consideration of its poor step covering property. At the ion doping step, the density of the fixed charges in the film and thus the threshold voltage of the TFT can be controlled more precisely by controlling the amount of ions to be implanted in the underlying film. Thus, in this alternative method, the threshold voltage of the TFT can be controlled with higher precision than in the control method using the oxygen ratio at sputtering described above.

The ions to be implanted in the underlying film at the ion doping step are desirably oxygen ions. When oxygen ions are implanted in the silicon oxide film, the oxygen in the film is supersaturated, generating supersaturated oxygen ions which work as negative fixed charges E2. Since oxygen is originally contained in the composition of the silicon oxide film, the oxygen ions do not adversely affect the TFT device characteristics. Other effective ion species to be implanted in the film include aluminum ions, which act as negative fixed charges E2 in the silicon oxide film more efficiently than oxygen ions.

In the method for fabricating the TFT according to the present invention, the thickness of the active layer 9 is desirably about 60 nm or less. The thickness of the active layer 9 is one of important points of the present invention. Therefore, as described above, in order to obtain a sufficient effect, the thickness of the active layer 9 should be equal to or less than the thickness of a depletion layer which expands during the operation of the TFT, i.e., a thickness in the range where the whole active layer 9 is depleted. Specifically, by setting the thickness at about 60 nm or less, the whole active layer 9 is depleted, i.e., no back-channel effect arises, so that the whole active layer 9 is affected by the fixed charges E1 and E2 in the underlying film and the gate insulating film. This state which is most suitable for the present invention is obtained by setting the thickness of the active layer 9 at about 60 nm or less.

As described above, the silicon film as the active layer 9 is required to be as thin as about 60 nm or less. In general, the thinner a crystalline silicon thin film is, the worse the film quality (crystallinity) is. Since the present invention aims at realizing a TFT with high performance, the method for forming the active layer 9 according to the present invention should desirably provide a silicon thin film which has a thickness in the above-described range and also has high crystallinity.

In the method where a crystalline silicon film is directly formed by CVD or the like as is generally employed in the IC fabrication process, crystallization proceeds simultaneously with the progress of the film formation step. This makes it difficult to obtain crystalline silicon with a large grain size unless the thickness of the silicon film is large.

In the method where an amorphous silicon film is first formed and then crystallized by heating under a solid-phase state, the crystallization step is influenced by the thickness of the silicon film. Specifically, if the thickness is as small as 100 nm or less, a crystalline silicon film with a large grain size which is one of the important features of this method is not obtained. Moreover, grown crystal grains in the crystalline silicon film tend to collide with one another, thereby generating a grain boundary. The grain boundary works as a trap state for carriers, while each of the crystal grains forms a twin structure, producing a number of crystal defects called twin defects in each crystal grain. Therefore, the resultant TFT including the active layer 9 formed in the above manner which is thinned as defined in the present invention cannot exhibit high performance and fails to provide the effect of the present invention.

One of the methods for forming the silicon thin film which can attain the above objective is a method where an amorphous silicon film is irradiated with laser light and crystallized in the solidification process from a melted state. In this method, the crystallinity of the silicon film is substantially determined by an effective laser energy applied to the silicon film. As the silicon film is thinner, the heat capacity of the silicon film is smaller and thus the effective laser energy applied to the unit volume of the silicon film is larger. As the effective laser energy is larger, the crystallinity of the silicon film is better. In other words, this method provides better, not worse, crystallinity as the silicon film is thinner. This method is therefore optimal for the present invention. In this method, also, since the crystallization is effected by utilizing the solidification process from a melted state, the crystallinity of each crystal grain is excellent. Furthermore, only the silicon film to be annealed can be efficiently heated by selecting the wavelength of irradiation light. This prevents the underlying glass substrate from being thermally damaged.

Excimer laser light with a wavelength of about 400 nm or less is preferable as the laser light for crystallizing the silicon film in the above method for forming the crystalline silicon film. Since the silicon film has a large absorption coefficient for light with a wavelength of 400 nm or less, the energy of such light is efficiently received by the silicon film, so that a high-quality crystalline silicon film is obtained and the thermal damage to the underlying glass substrate and the like is comparatively small. Moreover, since excimer laser light has a high oscillation output and high stability, the beam size of the light can be increased to some extent. Thus, the excimer laser light is most suitable as the annealing means for a silicon film of a large-area substrate.

Another method for forming the silicon thin film effective for the present invention is a method where an amorphous silicon film is first added with a catalyst element for facilitating the crystallization, heat-treated, and then crystallized under a solid-phase state. This method is completely different in the crystal growth process from conventional solid-phase crystal growth methods. The crystalline silicon film with best crystallinity can be obtained when the thickness of the silicon film is in the range of 30 nm to 50 nm. This is therefore a very effective method for obtaining a thin active layer according to the present invention.

The reason for the above is as follows. While each grain in a crystalline silicon film crystallized by a normal solid-phase growth method has a twin structure, each grain in the crystalline silicon film formed by this method includes a network of multiple column-like crystals. Each column-like crystal is in a substantially single-crystalline state. The column-like crystal has a square section with each side of about 80 nm under a stress-free state. If the thickness of the silicon film is smaller than this value, the width of the column-like crystal in the plane direction expands. For example, the width becomes as large as about 200 nm when the thickness of the silicon film is about 40 nm. In other words, as the width of one column-like crystal in the plane is larger, the crystallinity increases. Other advantages of this method are that the heating temperature can be lowered and that the processing time can be shortened.

As another method utilizing the above method, a portion of an amorphous silicon film is selectively added with a catalyst element and heated, so that only the portion where the catalyst element has been selectively added is crystallized first. Thereafter, the crystal growth is allowed to proceed from the catalyst-containing portion laterally (in a direction parallel to a surface of a substrate). As a result, the inside of the lateral crystal growth region is crowded with column-like crystals whose growth directions are substantially the same, and exhibits good crystallinity compared with a region where the catalyst element is directly added to generate random crystal nuclei. Accordingly, a semiconductor device with high performance can be obtained by using the crystalline silicon film having the lateral crystal growth region as an active region of a semiconductor element such as the channel region of the TFT. When a high-quality crystalline silicon film is required, the crystalline silicon film obtained by the crystallization using a catalyst element may be further irradiated with light for re-crystallization, or may be further heat-treated at high temperature.

Examples of the catalyst element usable in the present invention include Ni, Co, Pd, Pt, Cu, Ag, Au, In, Sn, Al, and Sb. Among these elements, Ni can provide most eminent effect. The reason will be described using a model as follows. That is, the catalyst element does not act individually, but affects the crystal growth by bonding with the silicon film to become a silicide. The crystal structure of the resultant silicide serves as a kind of mold at the crystallization of the amorphous silicon film, facilitating the crystallization. Ni forms a silicide $NiSi_2$ together with two Si's. $NiSi_2$ has a fluorite-type crystal structure which greatly resembles a diamond structure of single-crystalline silicon. Furthermore, the lattice constant of $NiSi_2$, i.e., 0.5406 nm, is very close to that of the diamond structure of crystalline silicon, i.e., 0.5430 nm. $NiSi_2$ is therefore most suitable as the mold for the crystallization of the amorphous silicon film. Thus, Ni is most suitable as the catalyst element used in the present invention.

Hereinbelow, the present invention will be described by way of examples with reference to the accompanying drawings.

EXAMPLE 1

Figure 3A:
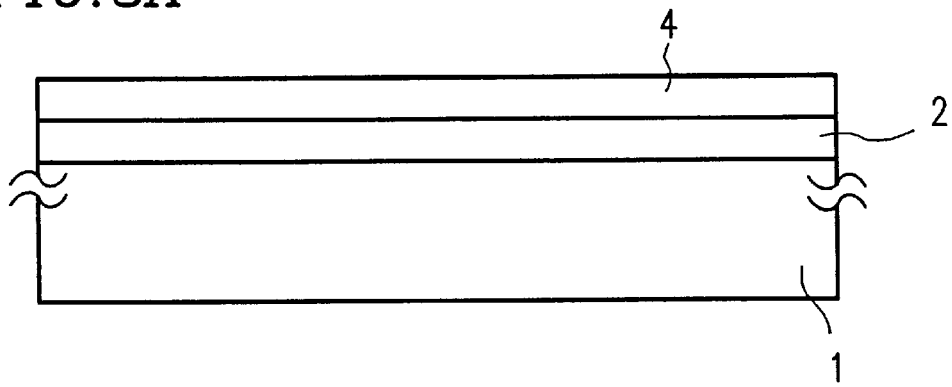
FIGS. 3A to 3E are sectional views illustrating the steps of a fabrication method of Example 1 according to the present invention.
Figure 3B:
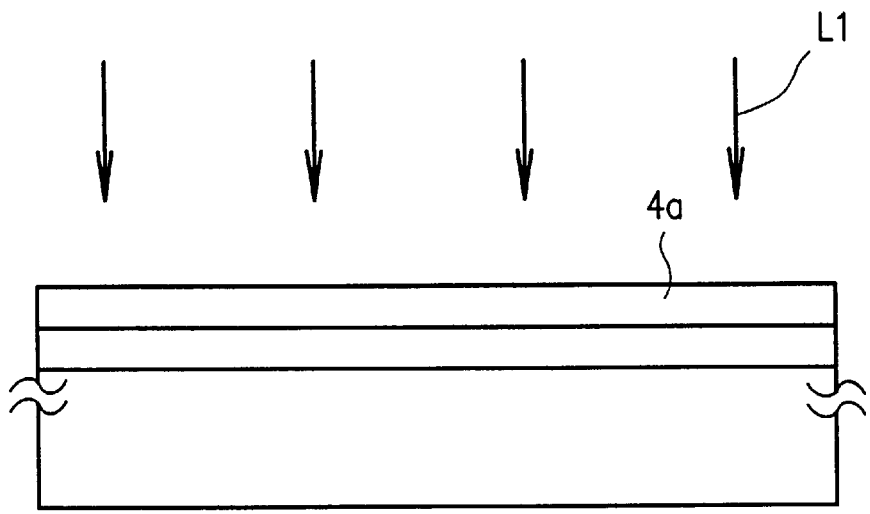
Figure 3C:
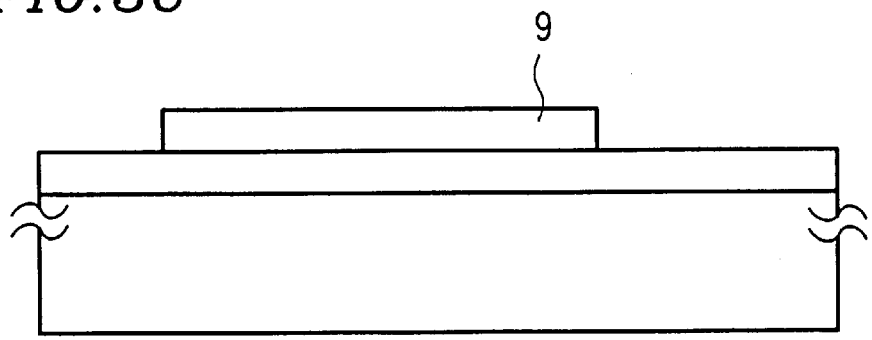
Figure 3D:
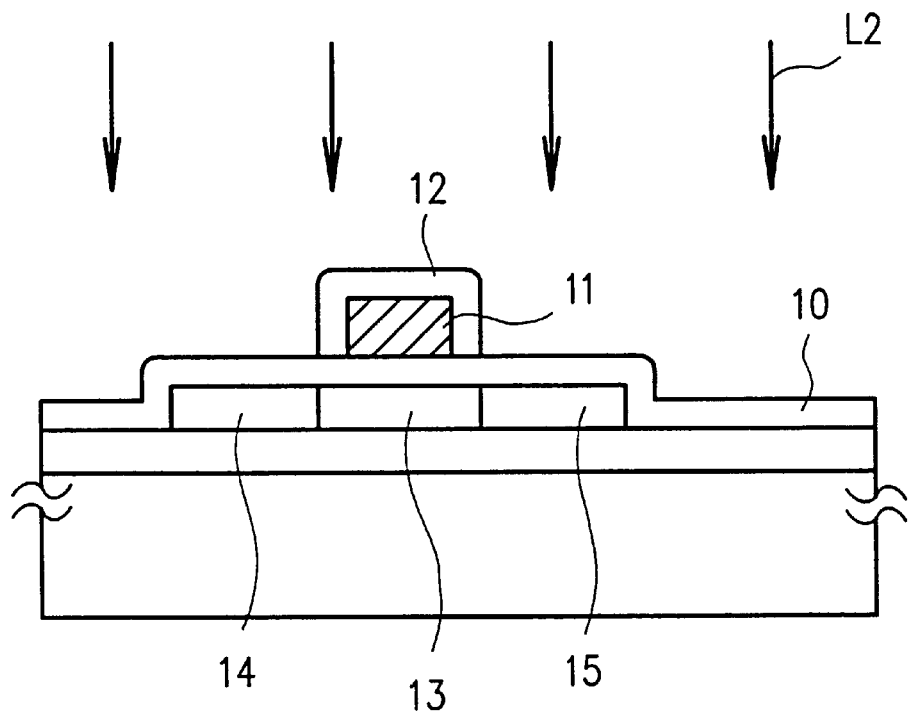
Figure 3E:
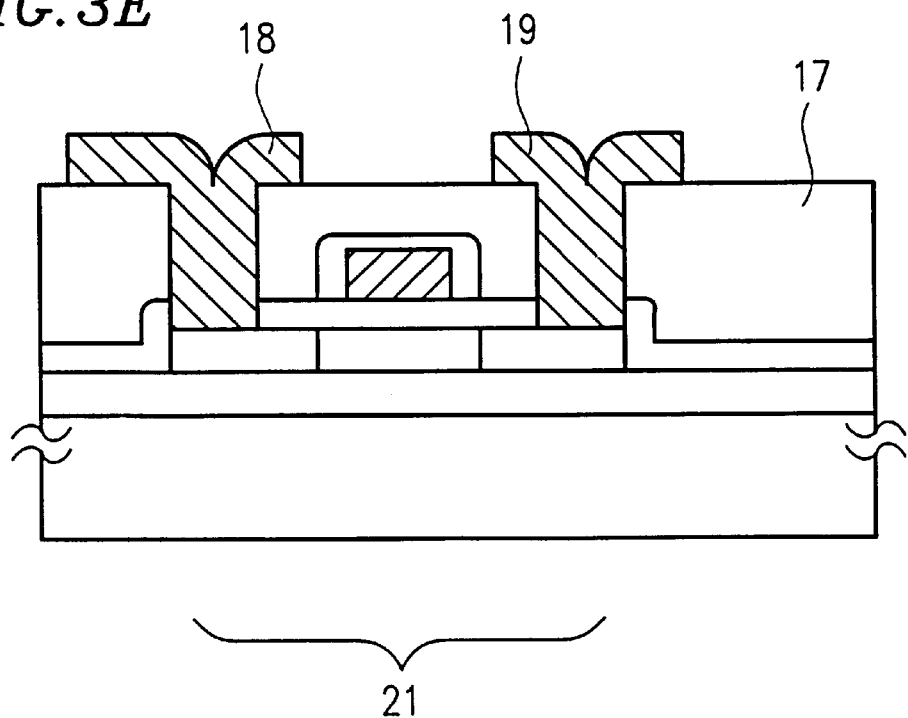

FIGS. 3A to 3E show a method for fabricating an n-channel TFT of Example 1 according to the present invention. The configuration and fabrication method of the TFT of this example will be described in the order of the fabrication steps. FIG. 3E shows an n-channel TFT 21 of Example 1 in the complete form.

Referring to FIG. 3A, an underlying film 2 made of silicon oxide with a thickness of about 300 nm is formed on a glass substrate 1 by sputtering, for example. Specifically, the silicon oxide film was formed by sputtering using a quartz target under an atmosphere of a mixed gas of Ar and $O_2$ at a substrate temperature of 200° C. The gas pressure was set at 0.2 to 1.0 Torr, for example 0.6 Torr, and the oxygen flow ratio ($O_2/(Ar+O_2)$) was set at about 0.04 (4%) to about 0.4 (40%), for example 0.1 (10%). By controlling the oxygen flow ratio, the threshold voltage ($V_{TH}$) of the resultant TFT can be controlled. In other words, an appropriate value should be set for the oxygen flow ratio by predetermining the density of fixed charges in a gate insulating film to be formed later. The silicon oxide film 2 formed in Example 1 has negative fixed charges, and the density of the fixed charges was about $2 \times 10^{11}$ $cm^{-2}$.

Thereafter, an amorphous silicon (a-Si) film 4 with a thickness of 20 to 60 nm, for example about 30 nm, is formed by low pressure CVD or plasma CVD. When the a-Si film 4 is formed by plasma CVD, the resultant film contains a number of hydrogen atoms, which may cause peeling-off of the film at a subsequent laser irradiation step. Such hydrogen atoms therefore need to be removed from the film by heat treatment for several hours at about 450° C.

Referring to FIG. 3B, the resultant structure is irradiated with laser light L1 to crystallize the a-Si film 4. An XeCl excimer laser (wavelength: 308 nm, pulse width: 40 nsec.) was used for the laser light. At the light irradiation, the substrate was heated to between 200° C. and 500° C., for example 400° C., and the energy density of the laser light L1 was set in the range of 250 to 400 $mJ/cm^2$, for example 300 $mJ/cm^2$. The overlap amount of the beam in the sequential scanning at the light irradiation was set at 90%. This means that any arbitrary point on the a-Si film 4 is irradiated with the laser light ten times. The a-Si film 4 is therefore heated exceeding the melting point thereof to be melted and then solidified. Thus, a crystalline silicon film 4a with good crystallinity is formed.

Referring to FIG. 3C, unnecessary portions of the crystalline silicon film 4a are removed to isolate devices from one another, so as to form a pattern of island-like crystalline silicon films 9 each of which is to constitute an active region (including a source region, a drain region, and a channel region) of the TFT.

Referring to FIG. 3D, a silicon oxide film as a gate insulating film 10 with a thickness of 20 to 150 nm, for example about 100 nm, is formed covering the crystalline silicon films 9 which are to be the active regions. In this example, the silicon oxide film was formed by decomposing and depositing tetraethoxyorthosilicate (TEOS) together with oxygen by RF plasma CVD at a substrate temperature of 150° C. to 600° C., preferably 300° C. to 450° C. Alternatively, low pressure CVD or atmospheric pressure CVD may be employed using TEOS together with ozone gas at a substrate temperature of 350° C. to 600° C., preferably 400° C. to 550° C. After the film formation, the silicon oxide film was annealed under an inert gas atmosphere for several hours at 550° C. to 600° C. to improve the bulk characteristic of the gate insulating film 10 itself and the interface characteristic between the crystalline silicon film 9 and the gate insulating film 10. The resultant gate insulating film 10 has positive fixed charges, and the density of the fixed charges is about $1 \times 10^{11}$ $cm^{-2}$.

Subsequently, an Al film with a thickness of 300 to 600 nm, for example about 400 nm, is formed by sputtering. The Al film is patterned to form gate electrodes 11. The surface of each Al electrode is then anodically oxidized to form an oxide layer 12 on the surface of the Al electrode as shown in FIG. 3D. The anodic oxidation is performed in an ethylene glycol solution containing 1 to 5% of tartaric acid by first increasing the voltage up to 220 V at a constant current and then holding this state for one hour. The thickness of the resultant oxide layer 12 is about 200 nm. The thickness of the oxide layer 12 defines the length of an offset gate region at a subsequent ion doping step. Accordingly, the length of the offset gate region can be determined at this anodic oxidation step.

Thereafter, impurities (phosphorus) are implanted in the active region by an ion doping method using the gate electrode 11 and the surrounding oxide layer 12 as a mask. The ion implantation was performed using phosphine ($PH_3$) as a doping gas at an accelerating voltage of 60 to 90 kV, for example about 80 kV, and at a dose amount of $1 \times 10^{15}$ to $8 \times 10^{15}$ cm$^{-2}$, for example, $2 \times 10^{15}$ cm$^{-2}$. By this step, regions 14 and 15 with impurities implanted therein are formed to be used as the source region and the drain region of the TFT, while a region 13 with no impurities implanted therein is formed to be used as the channel region of the TFT.

Still referring to FIG. 3D, the resultant structure is irradiated with laser light L2 for annealing, so as to activate the implanted impurities and simultaneously improve the crystallinity of a portion where the crystallinity has been degraded at the preceding impurity implantation step. An XeCl excimer laser (wavelength: 308 nm, pulse width: 40 nsec.) was used to effect the irradiation at an energy density of 150 to 400 mJ/cm$^2$, preferably 200 to 250 mJ/cm$^2$. The sheet resistance of the thus-formed n-type impurity (phosphorus) regions 14 and 15 was in the range of 200 to 800 Ω per side of a square.

Referring to FIG. 3E, a silicon oxide film with a thickness of about 600 nm is formed as an interlayer insulating film 17. An interlayer insulating film with good step covering property can be formed using TEOS as a material together with oxygen by plasma CVD or together with ozone by low pressure CVD or atmospheric pressure CVD.

Thereafter, contact holes are formed through the interlayer insulating film 17, to form a source electrode 18 and a drain electrode 19. Each of the source electrode 18 and the drain electrode 19 are of a two-layer structure composed of a metal film such as a titanium nitride film and the Al film. The titanium nitride film is formed as a barrier film for preventing Al from diffusing into the semiconductor layer. In the case where the TFT 21 of this example is used as a pixel switching element of an active matrix substrate for a liquid crystal display device, the drain electrode 19 is made of a transparent conductive film such as an ITO film and receives video signals from the source electrode 18. In the case where the TFT 21 is used as an element of a thin film IC, a contact hole is additionally formed above the gate electrode 11 for necessary wiring.

The resultant structure is annealed at 350° C. under a hydrogen atmosphere for about one hour, so as to complete the n-channel TFT 21 shown in FIG. 3E. By this annealing, hydrogen atoms are supplied to the interface between the active region and the gate insulating film of the TFT 21 to effectively reduce the number of dangling bonds which may degrade the TFT characteristics. To further protect the TFT 21, portions of the resultant structure which are considered necessary may be covered with a silicon nitride film formed by plasma CVD using $SiH_4$ and $NH_3$ as material gases.

The thus-fabricated TFT exhibited good characteristics; i.e., a field effect mobility of 50 to 70 cm$^2$/Vs, a threshold voltage of 2 to 2.5 V, and an S value indicating the sharpness of the rising of a drain current of 0.4 to 0.5 V/digit. The drain current of the TFT rose from the point where the gate voltage is 0 V, indicating that the TFT does not have the depletion type characteristic, and the threshold voltage was reduced.

EXAMPLE 2

Figure 5A:
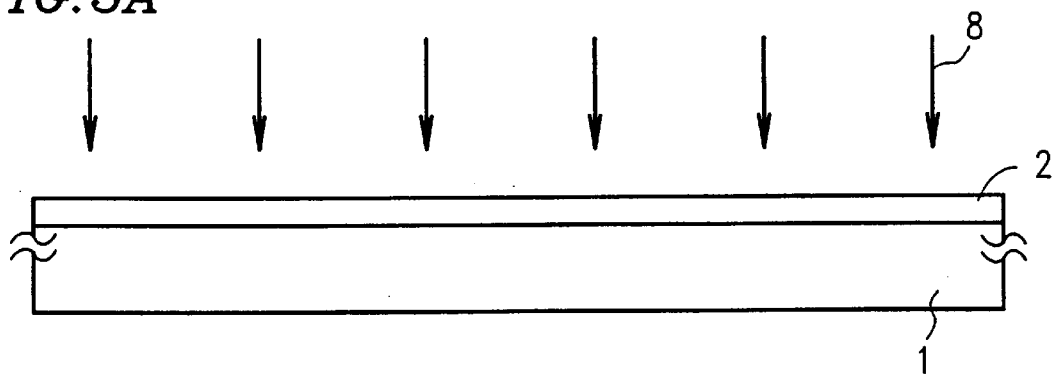
FIGS. 5A to 5F are sectional views taken along line V—V of FIG. 4, illustrating the steps of the fabrication method of Example 2 according to the present invention.
Figure 5B:
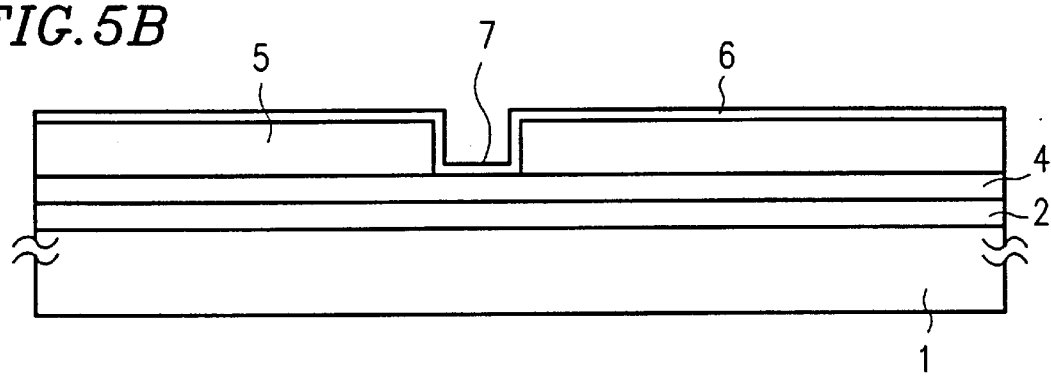
Figure 5C:
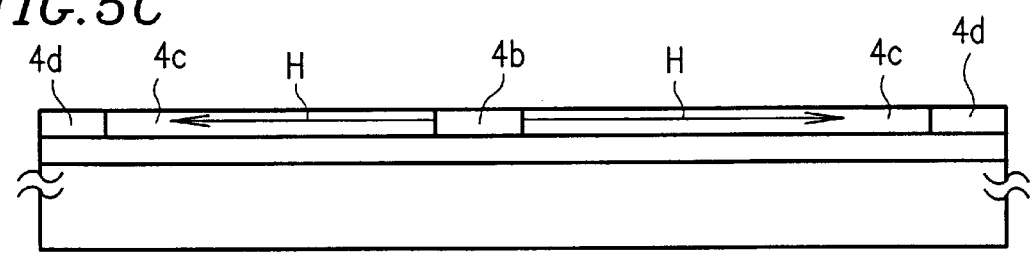
Figure 5D:
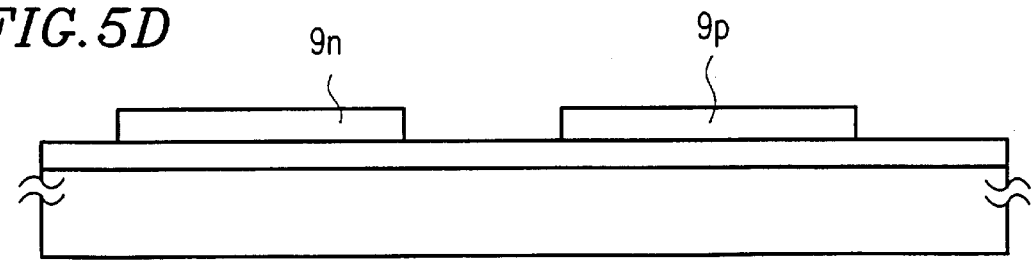
Figure 5E:
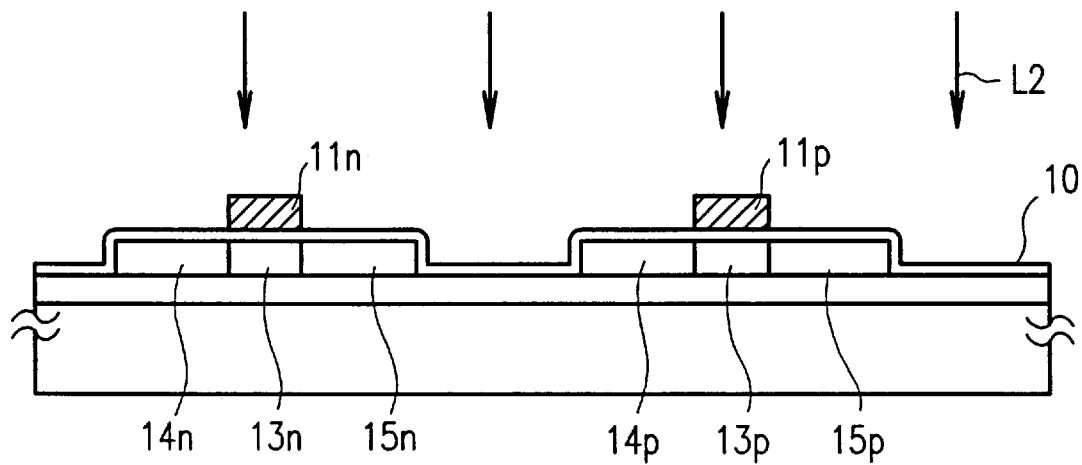
Figure 5F:
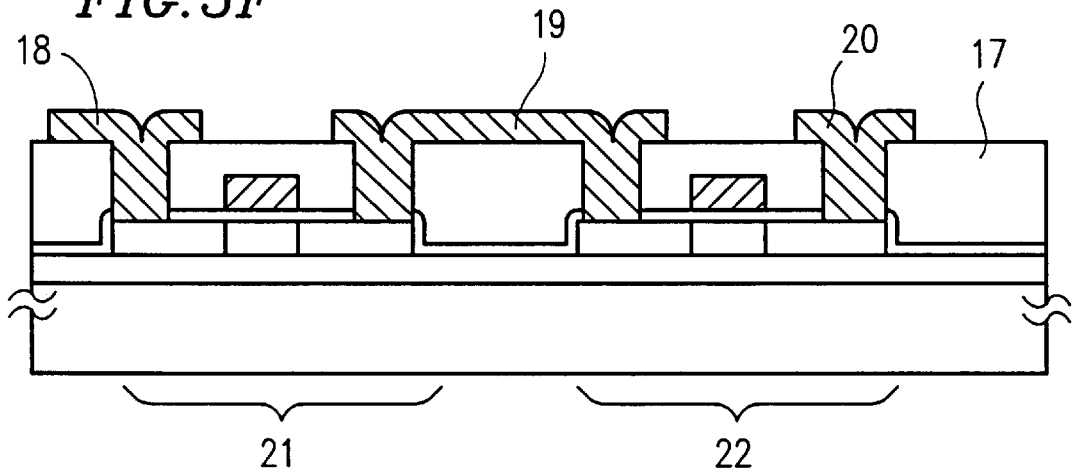
Figure 6:
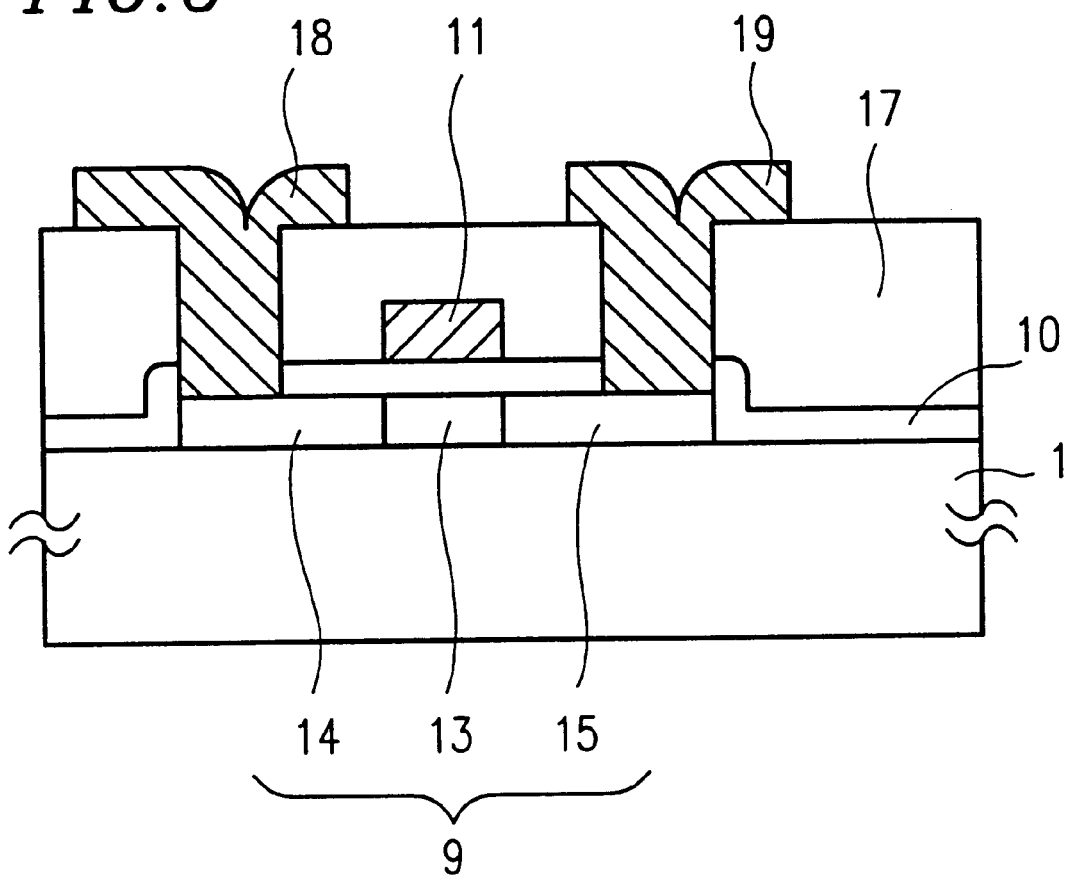
FIG. 6 is a sectional view of a conventional TFT.

FIGS. 4 and 5A to 5F show a CMOS circuit and its fabrication method of Example 2 according to the present invention. The CMOS circuit of this example includes an arrangement of a plurality of TFTs of the present invention. The configuration and fabrication method of the CMOS circuit of this example will be described in the order of the fabrication steps illustrated in FIGS. 5A to 5F. FIG. 5F shows a complete form of the CMOS circuit of Example 2 which is composed of an n-type TFT 21 and a p-type TFT 22.

FIGS. 5A to 5F illustrate the steps for fabricating a peripheral driving circuit for an active matrix liquid crystal display device and a circuit of a CMOS structure where an n-channel TFT and a p-channel TFT are complementarily combined forming a general thin film IC on a glass substrate.

Referring to FIG. 5A, an underlying film 2 composed of a silicon oxide film with a thickness of about 300 nm is formed on a glass substrate 1 by plasma CVD. $SiH_4$ and $N_2O$ were used as material gases which were decomposed and deposited by RF plasma under a low pressure atmosphere of about 0.5 to 1.5 Torr, for example about 0.8 Torr, at a substrate temperature of 300° C. to 350° C. Strictly speaking, the thus-formed film contains some SiON components, and oxygen-deficient Si, SiOH, and the like form positive fixed charges.

Thereafter, oxygen ions a are doped in the underlying film 2. The ion doping was performed at an accelerating voltage of 5 to 15 kV, for example about 10 kV, and a dose amount of $5 \times 10^{13}$ to $1 \times 10^{15}$ cm$^{-2}$, for example $2 \times 10^{14}$ cm$^{-2}$. The threshold voltage ($V_{VH}$) of the resultant TFT can be controlled by controlling the dose amount. The supersaturated oxygen ions doped in the underlying film 2 work as negative fixed charges, but all ions of the dose amount do not necessarily work as negative fixed charges. Some ions bond with oxygen-deficient Si, and some ions exist in a state inactive as fixed charges. These are greatly influenced by the quality of the underlying film. Therefore, appropriate conditions should be predetermined using the underlying film to be actually used. The remaining doped oxygen ions 8 form negative fixed charges which are active in the underlying film 2, and cancel positive fixed charges which originally exist in the underlying film 2, so that the underlying film 2 as a whole becomes a film having negative fixed charges. The resultant density of the negative fixed charges in the underlying film 2 was $4 \times 10^{11}$ cm$^{-2}$.

Referring to FIG. 5B, an intrinsic (I-type) amorphous silicon (a-Si) film 4 with a thickness of 20 to 60 nm, for example 50 nm, is formed on the silicon oxide film 2 by low pressure CVD or plasma CVD.

Thereafter, a photosensitive resin (photoresist) is applied to the surface of the a-Si film 4 and subjected to light exposure and development to form a mask 5. A slit portion of the a-Si film 4 is exposed via a through hole of the photoresist mask 5 at a region 7. That is, as shown in FIG. 4 where the TFT is viewed from the top, a portion of the a-Si film 4 is exposed at the region 7, while the remaining portion is covered with the photoresist mask.

Still referring to FIG. 5B, Ni is deposited on the photoresist mask 5 and the a-Si film 4 by evaporation to form an Ni thin film 6. In this example, the thickness of the Ni thin film 6 was controlled to be about 1 to 2 nm by setting the distance between an evaporation source and the substrate longer than normal to reduce the evaporation rate. The surface density of the Ni thin film 6 on the substrate 1 was actually measured and found to be about $1\times10^{13}$ atoms/cm$^2$. The portion of the Ni thin film 6 located on the photoresist mask 5 is removed by removing the photoresist mask 5, resulting in a selective addition of a minute amount of Ni to the portion of the a-Si film 4 at the region 7. The remaining Ni is then annealed under an inert atmosphere at a heating temperature of 550° C., for example, for 16 hours for crystallization.

At this time, the portion of the a-Si film 4 at the region 7 is crystallized in the vertical direction from the Ni deposited on the surface of the a-Si film 4 as the nucleus, to form a crystalline silicon film 4b. Then, crystal growth occurs in the area surrounding the region 7 extending from the region 7 laterally (in a direction parallel to the surface of the substrate) as shown by arrows H in FIGS. 4 and 5C, so as to form a laterally grown crystalline silicon film 4c.

The other portion of the a-Si film 4 remains as an amorphous silicon film 4d. The concentration of Ni in the laterally grown crystalline silicon film 4c was about $5\times10^{16}$ atoms/cm$^3$. The length of the area where the crystal growth occurred in a direction parallel to the substrate 1 shown by the arrow H was about 80 $\mu$m. The laterally grown crystalline silicon film 4c has sufficiently high crystallinity itself, but it may be subjected to laser light irradiation, high-temperature annealing, and the like to further increase the crystallinity.

Referring to FIG. 5D, the portion of the laterally grown crystalline silicon film 4c other than the portions thereof which are to be active regions (device regions) 9n and 9p of the resultant TFT is removed by etching so as to isolate each device.

Referring to FIG. 5E, a silicon oxide film as a gate insulating film 10 with a thickness of 20 to 150 nm, for example 100 nm, is formed over the island like silicon films 9n and 9p. In this example, this film formation was performed by RF plasma CVD using SiH$_4$ and N$_2$O as material gases under the same conditions as those used for the formation of the underlying film 2. After the film formation, the gate insulating film 10 was annealed under an inert gas atmosphere at 550° C. to 600° C. for several hours to improve the bulk characteristic of the gate insulating film 10 itself, the interface characteristic between the crystalline silicon film 9n and the gate insulating film 10, and the interface characteristic between the crystalline silicon film 9p and the gate insulating film 10.

Subsequently, an Al film (including 0.1 to 2% of silicon) with a thickness of 400 to 800 nm, for example 500 nm, is formed by sputtering and then patterned, to form gate electrodes 11n and 11p.

Thereafter, impurities (phosphorus or boron) are implanted in the active regions 9n and 9p by ion doping using the gate electrodes 11n and 11p as a mask. The ion implantation was performed using phosphine (PH$_3$) and diborane (B$_2$H$_6$) as doping gases at an accelerating voltage of 60 to 90 kV, for example about 80 kV, for phosphine and 40 to 80 kV, for example about 65 kV, for diborane at a dose amount of $1\times10^{15}$ to $8\times10^{15}$ cm$^{-2}$, for example $2\times10^{15}$ cm$^{-2}$ for phosphorus and $5\times10^{15}$ cm$^{-2}$ for boron.

By this step, regions 13n and 13p which are covered with the gate electrodes 11n and 11p and thus have no impurities implanted therein are formed to be used as the channel regions of the TFT. At the doping, impurities of each element are selectively doped in the active regions by covering the portions thereof where the doping is unnecessary with a photoresist. As a result, n-type impurity regions 14n and 15n and p-type impurity regions 14p and 15p are formed, so that the n-channel TFT 21 and the p-channel TFT 22 are formed as shown in FIGS. 5E and 5F. FIG. 4 shows this state viewed from the top. As is observed from FIG. 4, the active regions 9n and 9p are arranged so that the carrier moving direction (from source to drain) is parallel to the crystal growth direction H. With this arrangement, the carrier mobility of the TFT further increases.

Thereafter, as shown in FIG. 5E, the resultant structure is irradiated with laser light L2 for annealing, so as to activate the implanted impurities. An XeCl excimer laser (wavelength: 308 nm, pulse width: 40 nsec.) was used for the laser light, and the laser irradiation of four shots per location was performed at an energy density of 250 mJ/cm$^2$.

Referring to FIG. 5F, a silicon oxide film as an interlayer insulating film 17 with a thickness of about 600 nm is formed by plasma CVD using TEOS as a material. Contact holes are formed through the interlayer insulating film 17 to form electrodes/wirings 18, 19, and 20 of a two-layer structure composed of a metal film such as a titanium nitride film and the Al film, for example. The resultant structure is annealed at 350° C. under a hydrogen atmosphere for about one hour, to complete the n-channel TFT 21 and the p-channel TFT 22.

In the thus-fabricated CMOS circuit, each TFT exhibited good characteristics; i.e., a field effect mobility of 100 to 120 cm$^2$/Vs for the n-channel TFT and 80 to 90 cm$^2$/Vs for the p-channel TFT, and a threshold voltage of 1.5 to 2 V for the n-channel TFT and −2 to −2.5 V for the p-channel TFT. Also, the S value indicating the sharpness of the rising of a drain current was as good as 0.3 to 0.4 V/digit for the n-channel TFT and 0.4 to 0.5 V/digit for the p-channel TFT.

Conventionally, the absolute value of the threshold voltage is high especially in the p-channel TFT, preventing the resultant CMOS circuit from being driven at low power consumption. In the CMOS circuit fabricated in Example 2, since the drain current rises from the point where the gate voltage is 0 V both for the n-channel TFT and the p-channel TFT, good threshold voltages as the values described above were obtained.

The present invention is not restricted to Examples 1 and 2 described above, but various alterations based on the technical thoughts of the present invention are possible.

For example, in Examples 1 and 2 the method for fabricating a TFT was described for the case where the underlying film had negative fixed charges and the gate insulating film had positive fixed charges. The effect of the present invention is also obtained for the reverse case. The methods for forming the silicon oxide film having positive fixed charges and the silicon oxide film having negative fixed charges are not restricted to the methods described in the above examples. For example, though in Example 2 oxygen ions which were to be negative fixed charges were added to the silicon oxide film by the ion doping method, other methods may also be employed.

The silicon oxide film may be formed by reactive sputtering under an oxygen atmosphere using single-crystalline silicon as a target or by thermal CVD.

Ion species other than oxygen ions which can serve to form negative fixed charges in the underlying film may also be used as the doping ions into the underlying film to obtain the effect of the present invention. Aluminum ions are the most suitable ion species among these ion species other than oxygen ions, which efficiently form negative fixed charges in the silicon oxide film.

The XeCl excimer laser was used for the crystallization of the a-Si film. The same effect can also be obtained when the a-Si film is crystallized by irradiation from any other energy beam sources. For example, a KrF excimer laser with a wavelength of 248 nm and a continuous oscillation Ar laser with a wavelength of 488 nm may also be used.

In Example 2, the catalyst element was selectively added to the a-Si film to crystallize the selected portion of the film in the solid-phase crystallization method. Alternatively, the catalyst element may be added to the entire a-Si film so as to simplify the fabrication process. In Example 2, also, a minute amount of Ni as the catalyst element was added by forming an Ni thin film on the surface of the a-Si film by evaporation. Other techniques can also be used. For example, a solution containing Ni salt dissolved therein may be applied to the surface of the a-Si film, an Ni thin film may be formed by sputtering or plating, or Ni may be directly added by ion doping. Metal elements other than Ni, such as Co, Pd, Pt, Cu, Ag, Au, In, Sn, Al, and Sb may also be used to facilitate the crystallization.

The present invention is applicable, not only to the active matrix substrate for liquid crystal displays, but also to a fit-type image sensor, a driver-incorporated thermal head, a driver-incorporated optical write device or display device using organic EL or the like as a light emitting element, a three-dimensional IC, and the like. The present invention can realize these devices with high performance such as high speed and high resolution. The present invention is further applicable, not only to the MOS transistor as described in the above examples, but also widely to any steps in the semiconductor fabrication process in general, including a bipolar transistor made of a crystalline semiconductor and a capacitance induction transistor.

Thus, according to the present invention, a TFT with high performance and high reliability where the threshold voltage is stable and power consumption is low can be realized. By using the TFT according to the present invention, a liquid crystal display device with a larger area which can display more vivid images is obtained. Also, a full-driver monolithic active matrix substrate with both an active matrix portion and a peripheral driving circuit portion formed on a same substrate can be fabricated in a simple process. This makes it possible to obtain a compact module with high performance at low cost.

The thin film IC having the TFT according to the present invention can satisfy high performance and high reliability requirements. Especially, the CMOS circuit having the n-type TFT and the p-type TFT can keep the absolute value of the threshold voltage at substantially the same level. This eliminates the necessity of a process for controlling the threshold voltage such as channel doping which has been conventionally required.

In the TFT according to the present invention, the control of the threshold voltage can be performed without causing problems relating to the TFT device characteristics, such as the dulling of the rising of a drain current in the subthreshold region and the increase in the leak current during the non-operation period, which are observed in the conventional methods for controlling the threshold voltage of the MOS TFT.

The first insulating film has two functions of controlling the threshold voltage of the TFT and preventing impurities from diffusing from the glass substrate to the active layer. Thus, the effect can be obtained without increasing the number of process steps.

The trap state density of charges such as carriers existing in the silicon oxide film is low. Accordingly, the fixed charges in the film do not vary, and thus the silicon oxide film is protected from external influences such as a gate bias applied to the TFT.

The TFT according to the present invention is prevented from being in the so-called back-channel state. Therefore, the influence of the fixed charges of the first and second insulating films expands to the whole active layer, so that the whole active layer, not only the upper or lower interface, becomes an n-type layer or a p-type layer.

In the method for fabricating the TFT according to the present invention, a high-quality insulating film can be obtained without damaging the surface of the underlying active layer (channel surface). The insulating film also has a good step covering property.

The first silicon oxide film is formed by sputtering using quartz as a target under an atmosphere containing oxygen. With this method, the silicon oxide film is prevented from being in the silicon-rich state and is more stabilized as a composition.

The second silicon oxide film can be formed by plasma CVD hardly damaging the underlying active layer. Also, by heat-treating the second silicon oxide film after the formation thereof by CVD, the gate insulating film (second silicon oxide film) can be made fine and further improves in its pressure resistance.

The film formation and the control of the threshold voltage of the TFT can be performed together at one time. Therefore, an extra step such as ion doping for the control of the threshold voltage can be omitted, and thus the process can be simplified.

Since the method for forming the underlying film is not restricted, an optimal film formation method suitable for the intended TFT can be selected.

The first silicon oxide film is doped with ions which are to become desired fixed charges in the first silicon oxide film, and the ion doping amount at the doping step is controlled. By this control, the density of the fixed charges in the film can be controlled more precisely, and thus the threshold voltage of the TFT can be controlled with higher precision.

In the step of forming the crystalline silicon film as the active layer by irradiating an amorphous silicon film with laser light, since the amorphous silicon film is thin, the effective laser energy applied per unit volume of the amorphous silicon film is large. This makes it possible to utilize the solidification process of the amorphous silicon film from a melted state for the crystallization of the amorphous silicon film. The resultant silicon film has good crystallinity. At this time, by using an excimer laser with a wavelength of 400 nm or less for which the silicon film has a large absorption coefficient, the energy of the laser can be efficiently applied to the silicon film. As a result, a high-quality crystalline silicon film can be obtained, and thermal damage to the underlying glass substrate and the like is comparatively small.

Each grain in the crystalline silicon film includes a network of multiple column-like crystals and each column-like crystal is in a substantially single-crystalline state. This improves the crystallinity, as well as decreasing the heating temperature and shortening the processing time.

A catalyst element is added to the amorphous silicon film to obtain the crystalline silicon film as the active layer. In this method, the inside of the lateral crystal growth region is crowded with column-like crystals of which growth directions are substantially the same, and exhibits good crystallinity. This makes it possible to obtain a semiconductor device of high performance.

In the case of using an element including Ni as the catalyst element, $NiSi_2$ has a fluorite-type crystal structure which greatly resembles a diamond structure of single-crystalline silicon. The lattice constant of $NiSi_2$ is also very close to that of the diamond structure. $NiSi_2$ therefore serves as a kind of mold for the crystallization of the amorphous silicon film, facilitating the crystallization of the amorphous silicon film.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film transistor formed on a substrate, the thin film transistor including an active layer and a first insulating film and a second insulating film sandwiching the active layer,
   wherein an overall polarity of fixed charges contained in the first insulating film is the reverse of an overall polarity of fixed charges contained in the second insulating film.

2. A thin film transistor according to claim 1, wherein the thin film transistor is a MOS field effect transistor, and the second insulating film constitutes a gate insulating film of the field effect transistor.

3. A thin film transistor according to claim 1, wherein a threshold voltage of the thin film transistor is controlled based on the polarities and amounts of the fixed charges contained in the first insulating film and the second insulating film.

4. A thin film transistor according to claim 1, wherein the substrate is a glass substrate, and the first insulating film is an underlying film for preventing impurities from diffusing from the glass substrate to the active layer.

5. A thin film transistor according to claim 1, wherein at least one of the first insulating film and the second insulating film contains silicon oxide as a major component, and the active layer comprises a silicon thin film having crystallinity.

6. A thin film transistor according to claim 1, wherein a thickness of the active layer is equal to or less than a thickness of a depletion layer which expands during operation of the thin film transistor.

7. A thin film transistor according to claim 1, wherein positive fixed charges of the first insulating film or the second insulating film are mainly composed of silicon ions having silicon dangling bonds.

8. A thin film transistor according to claim 1, wherein negative fixed charges of the first insulating film or the second insulating film are mainly composed of oxygen ions of non-bonded oxygen.

9. A method for fabricating a thin film transistor, comprising the steps of:
   forming a first silicon oxide film on a substrate;
   forming a silicon film having crystallinity which is to be an active layer on the first silicon oxide film; and
   forming a second silicon oxide film having fixed charges of a polarity reverse of a polarity of fixed charges contained in the first silicon oxide film on the silicon film as a gate insulating film.

10. A method for fabricating a thin film transistor according to claim 9, wherein the step of forming a first silicon oxide film is performed by sputtering, and the step of forming a second silicon oxide film is performed by CVD.

11. A method for fabricating a thin film transistor according to claim 9, wherein the step of forming a first silicon oxide film is performed by sputtering under an atmosphere containing at least oxygen using quartz as a target.

12. A method for fabricating a thin film transistor according to claim 9, wherein the step of forming a second silicon oxide film is performed by CVD using a silane gas as a material.

13. A method for fabricating a thin film transistor according to claim 9, wherein after being formed by CVD, the second silicon oxide film is heat-treated at a temperature of about 550° C. or more.

14. A method for fabricating a thin film transistor according to claim 9, wherein in the step of forming a first silicon oxide film, a threshold voltage is controlled by controlling a partial pressure of oxygen under an atmosphere for sputtering.

15. A method for fabricating a thin film transistor according to claim 9, wherein an oxygen ratio under an atmosphere for sputtering in the step of forming a first silicon oxide film is in a range of about 0.04 to about 0.4.

16. A method for fabricating a thin film transistor according to claim 9, wherein the step of forming a first silicon oxide film includes the step of doping ions which are to be negative fixed charges in the first silicon oxide film after the first silicon oxide film is formed.

17. A method for fabricating a thin film transistor according to claim 16, wherein in the step of doping ions, a threshold voltage is controlled by controlling an ion implantation amount.

18. A method for fabricating a thin film transistor according to claim 16, wherein the ions to be implanted in the step of doping ions are oxygen ions.

19. A method for fabricating a thin film transistor according to claim 16, wherein the ions to be implanted in the step of doping ions are aluminum ions.

20. A method for fabricating a thin film transistor according to claim 9, wherein a thickness of the active layer is about 60 nm or less.

21. A method for fabricating a thin film transistor according to claim 9, wherein the step of forming a silicon film which is to be the active layer includes irradiating an amorphous silicon film with laser light to crystallize the silicon film in a solidification process from a melted state.

22. A method for fabricating a thin film transistor according to claim 21, wherein an excimer laser light with a wavelength of about 400 nm or less is used as the laser light for the crystallization of the amorphous silicon film.

23. A method for fabricating a thin film transistor according to claim 9, wherein the step of forming a silicon film which is to be the active layer includes adding a catalyst element which facilitates the crystallization of an amorphous silicon film to the amorphous silicon film, heat-treating the amorphous silicon film, and crystallizing the amorphous silicon film in a solid-phase state.

24. A method for fabricating a thin film transistor according to claim 9, wherein the step of forming a silicon film which is to be the active layer includes selectively adding a catalyst element which facilitates the crystallization of an amorphous silicon film to the amorphous silicon film, and heat-treating the amorphous silicon film to allow crystal growth to proceed laterally from an area where the catalyst element has been selectively added toward a peripheral area thereof.

25. A method for fabricating a thin film transistor according to claim 23, wherein the catalyst element includes Ni.

26. A method for fabricating a thin film transistor according to claim 9, wherein the first silicon oxide film works as an underlying film which prevents impurities from diffusing from the substrate to the active layer.

* * * * *